US010163716B2

United States Patent
Bajaj et al.

(10) Patent No.: US 10,163,716 B2
(45) Date of Patent: *Dec. 25, 2018

(54) SYMMETRIC TUNNEL FIELD EFFECT TRANSISTOR

(71) Applicant: INTERNATIONAL BUSINESS MACHINES CORPORATION, Armonk, NY (US)

(72) Inventors: Mohit Bajaj, Bangalore (IN); Suresh Gundapaneni, Vijayawada (IN); Aniruddha Konar, Bangalore (IN); Narasimha R. Mavilla, Bangalore (IN); Kota V. R. M. Murali, Bangalore (IN); Edward J. Nowak, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/793,416

(22) Filed: Oct. 25, 2017

(65) Prior Publication Data

US 2018/0130655 A1     May 10, 2018

Related U.S. Application Data

(63) Continuation of application No. 15/404,955, filed on Jan. 12, 2017, now Pat. No. 9,911,598, which is a
(Continued)

(51) Int. Cl.
*H01L 21/8234*     (2006.01)
*H01L 29/66*     (2006.01)
(Continued)

(52) U.S. Cl.
CPC ............ *H01L 21/823418* (2013.01); *H01L 21/02414* (2013.01); *H01L 21/02483* (2013.01);
(Continued)

(58) Field of Classification Search
CPC ......... H01L 21/02414; H01L 21/02483; H01L 21/02565; H01L 21/823418; H01L 29/41725; H01L 29/772; H01L 29/78
See application file for complete search history.

(56) References Cited

U.S. PATENT DOCUMENTS 5,105,247 A    4/1992   Cavanaugh
6,274,916 B1    8/2001   Donath et al.
(Continued)

OTHER PUBLICATIONS

Boriskov et al., "Effect of Electric Field on the Metal-Insulator Transition with the Formation of Superstructure", Physics of Solid State, vol. 46, No. 5, pp. 922-926; 2004.
(Continued)

*Primary Examiner* — Eduardo A Rodela
(74) *Attorney, Agent, or Firm* — Steven Meyers; Andrew M. Calderon; Roberts Mlotkowski Safran Cole & Calderon, P.C.

(57) ABSTRACT

The present disclosure relates to semiconductor structures and, more particularly, to a symmetric tunnel field effect transistor and methods of manufacture. The structure includes a gate structure including a source region and a drain region both of which comprise a doped $VO_2$ region.

13 Claims, 4 Drawing Sheets

Related U.S. Application Data continuation of application No. 15/084,137, filed on Mar. 29, 2016, now Pat. No. 9,613,867, which is a continuation of application No. 14/837,785, filed on Aug. 27, 2015, now Pat. No. 9,379,253.

(51) Int. Cl.

| | | |
|---|---|---|
| *H01L 29/267* | (2006.01) | |
| *H01L 29/78* | (2006.01) | |
| *H01L 21/02* | (2006.01) | |
| *H01L 29/786* | (2006.01) | |
| *H01L 29/417* | (2006.01) | |
| *H01L 29/772* | (2006.01) | |
| *H01L 29/739* | (2006.01) | |
| *H01L 29/06* | (2006.01) | |
| *H01L 29/08* | (2006.01) | |
| *H01L 29/24* | (2006.01) | |
| *H01L 21/3115* | (2006.01) | |
| *H01L 21/8232* | (2006.01) | |
| *H01L 29/161* | (2006.01) | |
| *H01L 29/205* | (2006.01) | |

(52) U.S. Cl.
CPC .... *H01L 21/02565* (2013.01); *H01L 21/3115* (2013.01); *H01L 21/8232* (2013.01); *H01L 29/0653* (2013.01); *H01L 29/083* (2013.01); *H01L 29/0834* (2013.01); *H01L 29/0847* (2013.01); *H01L 29/161* (2013.01); *H01L 29/205* (2013.01); *H01L 29/24* (2013.01); *H01L 29/267* (2013.01); *H01L 29/41725* (2013.01); *H01L 29/66795* (2013.01); *H01L 29/66977* (2013.01); *H01L 29/7391* (2013.01); *H01L 29/772* (2013.01); *H01L 29/78* (2013.01); *H01L 29/785* (2013.01); *H01L 29/7869* (2013.01); *H01L 29/78681* (2013.01); *H01L 29/78693* (2013.01); *H01L 21/02581* (2013.01)

(56) References Cited

U.S. PATENT DOCUMENTS

| | | | |
|---|---|---|---|
| 6,333,543 | B1 | 12/2001 | Schrott et al. |
| 6,365,913 | B1 | 4/2002 | Misewich et al. |
| 6,555,393 | B2 | 4/2003 | Schrott et al. |
| 6,613,658 | B2 | 9/2003 | Koyama et al. |
| 6,624,463 | B2 | 9/2003 | Kim et al. |
| 6,933,553 | B2 | 8/2005 | Kim et al. |
| 7,408,217 | B2 | 8/2008 | Yoon et al. |
| 8,076,662 | B2 | 12/2011 | Ramanathan et al. |
| 8,178,400 | B2 | 5/2012 | Chang et al. |
| 8,183,559 | B2 | 5/2012 | Tsutsui |
| 8,384,122 | B1 | 2/2013 | Hu et al. |
| 8,471,329 | B2 | 6/2013 | Bhuwalka et al. |
| 8,854,860 | B2 | 10/2014 | Ribeiro et al. |
| 8,896,035 | B2 | 11/2014 | Murali et al. |
| 9,379,253 | B1 | 6/2016 | Bajaj et al. |
| 9,613,867 | B2 * | 4/2017 | Bajaj ............... H01L 21/823418 |
| 9,911,598 | B2 * | 3/2018 | Bajaj ................ H01L 21/02414 |
| 2006/0011942 | A1 | 1/2006 | Kim et al. |
| 2007/0049047 | A1 | 3/2007 | Fujimoto et al. |
| 2007/0069193 | A1 | 3/2007 | Yoon et al. |
| 2009/0242936 | A1 | 10/2009 | Cheng et al. |
| 2010/0140589 | A1 | 6/2010 | Ionescu |
| 2012/0241722 | A1 | 9/2012 | Ikeda et al. |
| 2012/0248425 | A1 | 10/2012 | Yang et al. |
| 2012/0286350 | A1 | 11/2012 | Doris et al. |
| 2014/0110765 | A1 | 4/2014 | Murali et al. |
| 2014/0238013 | A1 | 8/2014 | Wu et al. |
| 2014/0252415 | A1 | 9/2014 | Nayfeh |
| 2014/0264277 | A1 | 9/2014 | Doornbos et al. |
| 2014/0266391 | A1 | 9/2014 | Parkin et al. |
| 2015/0090959 | A1 | 4/2015 | Moselund et al. |
| 2015/0357480 | A1 | 12/2015 | Yu et al. |
| 2017/0062594 | A1 | 3/2017 | Bajaj et al. |
| 2017/0194467 | A1 | 7/2017 | Bajaj et al. |

OTHER PUBLICATIONS

List of IBM Patents or Patent Applications Treated as Related 1 page.
Office Action in related U.S. Appl. No. 15/794,526 dated Apr. 2, 2018, 9 pages.
Notice of Allowance in related U.S. Appl. No. 15/794,526 dated Aug. 16, 2018, 7 pages.

* cited by examiner

SYMMETRIC TUNNEL FIELD EFFECT TRANSISTOR

FIELD OF THE INVENTION

The present disclosure relates to semiconductor structures and, more particularly, to a symmetric tunnel field effect transistor and methods of manufacture.

BACKGROUND

Integrated Tunnel FETs (TFETs) are devices in which the gate controls the tunneling currents to the drain. TFETs are known to exhibit steep subthreshold slope and temperature independent operation, which makes the device suitable for low voltage applications.

Symmetric TFETs have some disadvantages, though. For example, symmetric TFETs have low ON current because of a long conduction path. They also exhibit increased junction capacitance. Also, in certain types of TFETs with a TSi-pad, there may be a high OFF current if the TSi-pad is not lightly doped. This, in turn, increases the series resistance of the device. Moreover, OFF state leakage may be an issue if band-gap engineering is not done properly.

SUMMARY

In an aspect of the disclosure, a structure comprises a gate structure including a source region and a drain region both of which comprise a doped $VO_2$ region.

In an aspect of the disclosure, a structure comprises a gate structure, an epitaxially grown source region on a first side of the gate structure, and an epitaxially grown drain region on a second side of the gate structure. The epitaxially grown source region and drain region comprises a $VO_2$ region doped with chromium.

In an aspect of the disclosure, a method comprises: depositing doped $VO_2$ region on a source side and a drain side of a device; and epitaxially growing semiconductor material for a source region and a drain region on the source side and the drain side of the device, respectively.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a symmetric tunnel field effect transistor (TFET) and methods of manufacture. More specifically, the symmetric TFET includes a source region and a drain region with a transition material and same type doping. In embodiments, the source region and drain region can be doped $VO_2$ to enable increased conduction. In embodiments, $VO_2$ can be doped with Chromium or other transition metals. The symmetric TFET can be implemented in FinFET and nanowire architectures.

The symmetric TFET of the present disclosure can be manufactured in a number of ways using a number of different tools. In general, though, the methodologies and tools are used to form structures with dimensions in the micrometer and nanometer scale. The methodologies, i.e., technologies, employed to manufacture the symmetric TFET structures have been adopted from integrated circuit (IC) technology. For example, the structures disclosed herein are built on wafers and are realized in films of material patterned by photolithographic processes on the top of a wafer. In particular, the fabrication of the symmetric TFET uses three basic building blocks: (i) deposition of thin films of material on a substrate, (ii) applying a patterned mask on top of the films by photolithographic imaging, and (iii) etching the films selectively to the mask.

Figure 1:
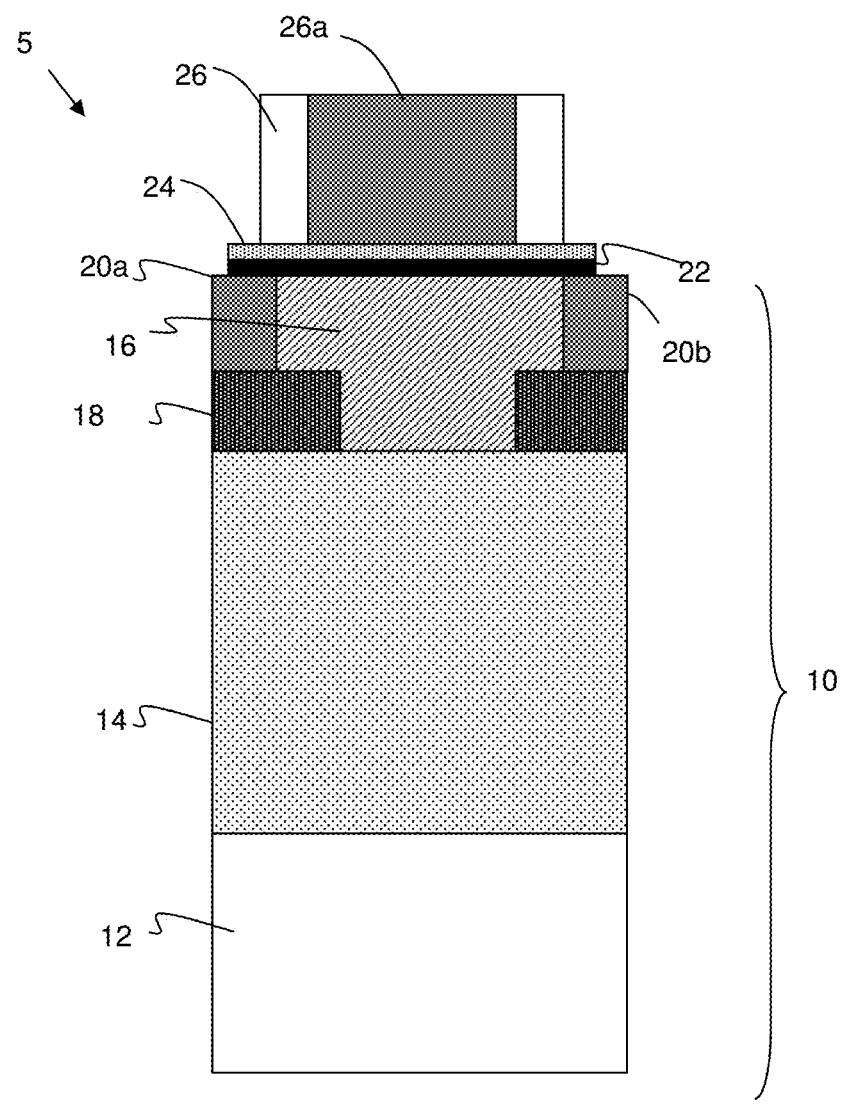
FIG. 1 shows a symmetric tunnel field effect transistor (TFET) and fabrication processes in accordance with aspects of the present disclosure.

FIG. 1 shows a symmetric TFET and fabrication processes in accordance with aspects of the present disclosure. More specifically, the structure 5 shown in FIG. 1 includes silicon on insulator (SOI) wafer 10, comprising a wafer 12, an insulator material 14 and semiconductor material patterned into a plurality of fins 16. In embodiments, the semiconductor material may be composed of any suitable semiconductor material including, but not limited to, Si, SiGe, SiGeC, SiC, Ge alloys, GaAs, InAs, InP, or heterojunctions with III-V materials.

In embodiments, the plurality of fins 16 can be formed using conventional lithography and etching processes. For example, the plurality of fins 16 can be formed using sidewall image transfer (SIT) techniques. In the SIT technique, for example, a mandrel is formed on the semiconductor material, using conventional deposition, lithography and etching processes. In an example of a SIT technique, the mandrel material can be, e.g., $SiO_2$, deposited using conventional chemical vapor deposition (CVD) processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the plurality of fins 16. Spacers are formed on the sidewalls of the mandrels which are preferably material that is different than the mandrels, and which are formed using conventional deposition processes known to those of skill in the art. The spacers can have a width which matches the dimensions of the plurality of fins 14, for example. The mandrels are removed or stripped using a conventional etching process, selective to the mandrel material. An etching is then performed within the spacing of the spacers to form the sub-lithographic features. The sidewall spacers can then be stripped. In embodiments, the plurality of fins 16 can be further etched in order to tune the device.

Still referring to FIG. 1, doped $VO_2$ regions 18 are deposited in the source region 20a and drain region 20b using conventional plasma enhanced CVD (PECVD) processes. In the embodiments, the doped $VO_2$ regions 18 can also be deposited by atomic layer deposition (ALD). In embodiments, the $VO_2$ regions 18 are doped with Chromium and/or other transition metals. The source region 20a and drain region 20b are then completed by epitaxially growing semiconductor material with either a p-type or n-type dopant. In embodiments, the semiconductor material can be, e.g., Si/Ge, Si/SiGe or heterojunctions with III-V materials. A workfunction metal 22, gate dielectric material 24, spacer material 26, and gate structure 26a can be formed using conventional deposition, lithography and etching (i.e., reactive ion etching (RIE)) processes, as should be known to those of skill in the art such that no further discussion is required for a complete understanding of the invention.

In accordance with the above fabrication processes, a symmetric TFET is formed, with the source region 20a and the drain region 20b both comprising epitaxially grown semiconductor material and doped $VO_2$ regions 18. It should also be understood by those of skill in the art that similar processes can be used to form nanowire architectures, with the doped $VO_2$ regions 18. In embodiments, the doped $VO_2$ regions 18 can include trivalent cations (e.g., $Cr_3+$ and/or $Al_3+$) to increase the transition temperature of $VO_2$, and can also be doped $VO_2$, e.g., 1.1% W, to bring the transition temperature to room temperature.

Figure 2:
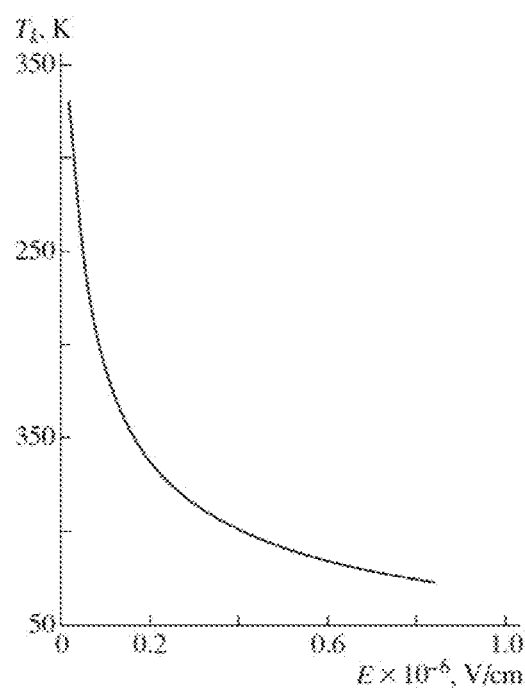
FIG. 2 shows a graph of field dependence of critical switching temperatures for a transition metal used in the TFET in accordance with aspects of the present disclosure.

FIG. 2 shows a graph of field dependence of critical switching temperatures for a transition metal, e.g., $VO_2$. This graph is provided to show the critical switching temperature of $VO_2$ at room temperature, e.g., 300K. Specifically, it is shown from the graph of FIG. 2 that $VO_2$ exhibits phase transition at an electric field of about 0.1 E×10$^{-6}$, V/cm. This data can be used to determine the electric fields in the ON state and the OFF state as shown in FIG. 3 in order determine transition states, e.g., insulator or metal, of the doped $VO_2$ at room temperature.

Figure 3:
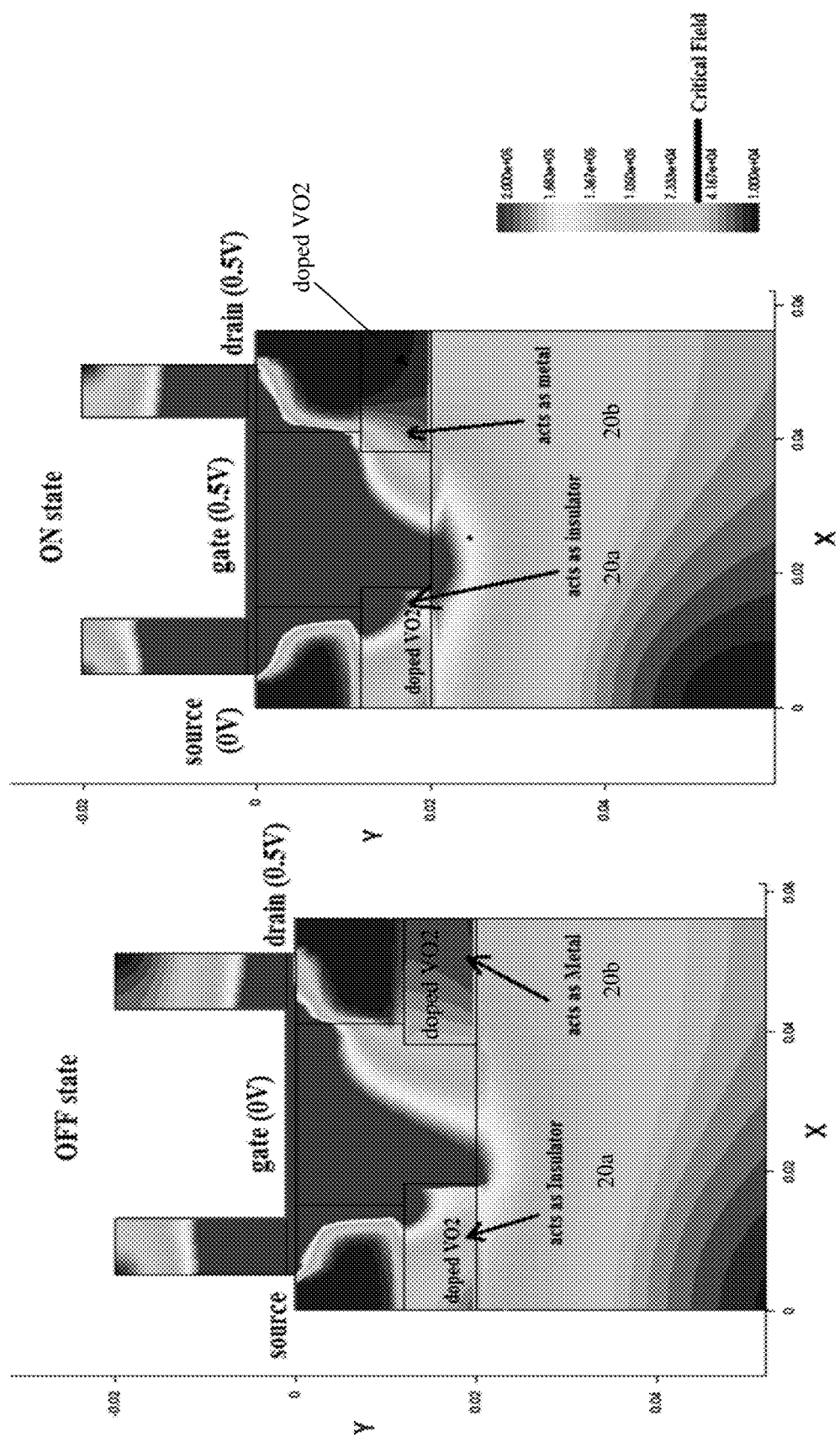
FIG. 3 shows electrical fields in an ON state and OFF state of the symmetric TFET of FIG. 1, in accordance with aspects of the present disclosure.

Prior to discussing the electric fields in the ON state and the OFF state as shown in FIG. 3, it is noteworthy to mention the resistance of doped $VO_2$ will abruptly increase at a certain transition temperature, e.g., 340° K. That is, after this transition temperature, the doped $VO_2$ will act as an insulator. Moreover, doped $VO_2$ exhibits the following characteristics/properties, amongst others, that are advantageous to the present application.

(i) Doped $VO_2$ acts as a high band gap insulator at room temperature;

(ii) Doped $VO_2$ exhibits changes in electrical conductivity up to 5 order of magnitude;

(iii) Doped $VO_2$ exhibits switching time on the order of 5 ps;

(v) Doped $VO_2$ exhibits a latent heat of transition favorably with the power dissipation in a single CMOS switching event, e.g., 0.1 eV at 103 cal/mol;

(vi) The transition temperature of $VO_2$ may be decreased by the addition of high-valent transition metals such as niobium, molybdenum or tungsten;

(vii) Trivalent cations ($Cr_3+$ and $Al_3+$) increase the transition temperature of $VO_2$;

(viii) A change in the transition temperature is exhibited by doping $VO_2$, e.g., 1.1% W doping brings the transition temperature down to room temperature; and (ix) The transition temperature of doped $VO_2$ can be decreased by applying an electric field.

FIG. 3 shows electrical fields in the ON state and OFF state of the symmetric TFET of FIG. 1 in accordance with aspects of the present disclosure. In particular, as shown in FIG. 3, with the drain at a high potential, e.g., 0.5V, in both an ON state and OFF state, doped $VO_2$ in the drain region 20b will transition to a metal and the doped $VO_2$ in the source region 20a will transition to an insulator. Advantageously, in the ON state, the drain region 20b is less resistive and therefore exhibits a high ON state current.

Figure 4A:
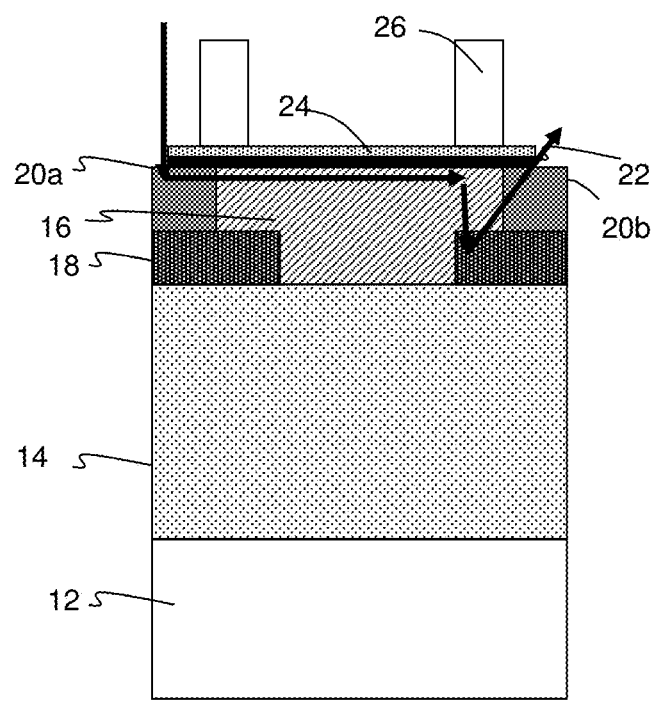
FIGS. 4a and 4b show current flows in the symmetric TFET of FIG. 1, in accordance with aspects of the present disclosure.
Figure 4B:
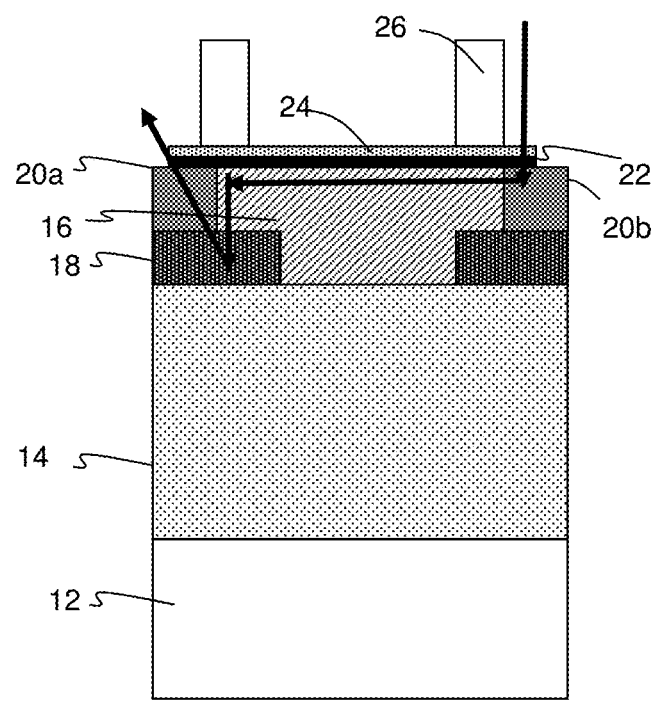

FIGS. 4a and 4b show current flows in the symmetric TFET of FIG. 1. More specifically, FIG. 4a schematically shows a current flowing from the source region 20a to the drain region 20b. FIG. 4b, though, schematically shows a current flowing in the opposite direction as shown in FIG. 4a. In other words, the source region 20a of the structure can act as a drain and the drain region 20b can act as a source, depending on the application of Vdd. Accordingly, in the symmetric TFET of the present invention, the source region and the drain region are interchangeable based on the application of Vdd.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   doping a source side and a drain side of a device with $VO_2$; and
   forming a source region and a drain region on the $VO_2$ doped source side and drain side, respectively,
   wherein the doped $VO_2$ region on the source side and the drain side is doped with a transition metal.

2. The method of claim 1, further comprising epitaxially growing material for a source region and a drain region of the device.

3. The method of claim 1, wherein the doping is a same type doping on the source side and the drain side.

4. The method of claim 1, wherein the source region and the drain region comprise epitaxially grown heterojunctions with III-V materials.

5. A method comprising:
   doping a source side and a drain side of a device with $VO_2$; and
   forming a source region and a drain region on the $VO_2$ doped source side and drain side, respectively,
   wherein the source region and the drain region comprise epitaxially grown SiGe.

6. The method of claim 5, wherein the doping is a same type doping on the source side and the drain side.

7. The method of claim 5, wherein the doped $VO_2$ region on the source side and the drain side includes trivalent cations.

8. The method of claim 7, wherein the trivalent cations comprise at least one of $Cr_{3+}$ and $Al_{3+}$.

9. The method of claim 5, wherein the source region and drain region comprises epitaxially grown Si/SiGe.

10. A method comprising:
   doping a source side and a drain side of a device with $VO_2$; and
   forming a source region and a drain region on the $VO_2$ doped source side and drain side, respectively,
   wherein the source region and the drain region comprise epitaxially grown heterojunctions with III-V materials.

11. The method of claim 10, wherein the doping is a same type doping on the source side and the drain side.

12. The method of claim 10, wherein the doped $VO_2$ region on the source side and the drain side includes trivalent cations.

13. The method of claim 12, wherein the trivalent cations comprise at least one of $Cr_{3+}$ and $Al_{3+}$.

* * * * *